(12) United States Patent
Yoshida

(10) Patent No.: US 10,812,748 B2
(45) Date of Patent: Oct. 20, 2020

(54) APPARATUS, SYSTEM, AND MOVING OBJECT

(71) Applicant: CANON KABUSHIKI KAISHA, Tokyo (JP)

(72) Inventor: Daisuke Yoshida, Ebina (JP)

(73) Assignee: CANON KABUSHIKI KAISHA, Tokyo (JP)

(*) Notice: Subject to any disclaimer, the term of this patent is extended or adjusted under 35 U.S.C. 154(b) by 26 days.

(21) Appl. No.: 15/934,647

(22) Filed: Mar. 23, 2018

(65) Prior Publication Data
US 2018/0288349 A1 Oct. 4, 2018

(30) Foreign Application Priority Data
Mar. 31, 2017 (JP) ................ 2017-072541

(51) Int. Cl.
| | | |
|---|---|---|
| H04N 5/378 | (2011.01) | |
| H03M 1/56 | (2006.01) | |
| H04N 5/355 | (2011.01) | |
| B60R 11/04 | (2006.01) | |
| H03M 1/12 | (2006.01) | |

(52) U.S. Cl.
CPC .......... *H04N 5/378* (2013.01); *H03M 1/56* (2013.01); *H04N 5/35527* (2013.01); *B60R 11/04* (2013.01); *H03M 1/123* (2013.01); *H03M 1/126* (2013.01)

(58) Field of Classification Search
None
See application file for complete search history.

(56) References Cited

U.S. PATENT DOCUMENTS

| | | | | |
|---|---|---|---|---|
| 4,701,793 A | * | 10/1987 | den Hollander | ..... H04N 7/0132 348/447 |
| 9,535,423 B1 | * | 1/2017 | Debreczeni | .......... G05D 1/0246 |
| 2016/0100115 A1 | * | 4/2016 | Kusano | ................... H03M 1/56 250/208.1 |

FOREIGN PATENT DOCUMENTS

| | | |
|---|---|---|
| CN | 101715084 A | 5/2010 |
| CN | 101729068 A | 6/2010 |
| CN | 103888687 A | 6/2014 |
| CN | 106357996 A | 1/2017 |
| JP | 2014-140152 A | 7/2014 |
| JP | 2016-76997 A | 5/2016 |

* cited by examiner

*Primary Examiner* — Samira Monshi
(74) *Attorney, Agent, or Firm* — Canon U.S.A., Inc. IP Division

(57) ABSTRACT

An apparatus includes a plurality of pixels, a plurality of circuits arranged correspondingly to the plurality of pixels, and an output line connected to the plurality of circuits. Each of the circuits generates a signal by converting an analog signal at a first conversion rate and a signal by converting, at a second conversion rate, the analog signal used for generating the signal converted at the first conversion rate. The circuit has a signal obtaining unit configured to obtain a difference signal corresponding to a difference between a signal converted at the first conversion rate and a signal converted at the second conversion rate.

19 Claims, 14 Drawing Sheets

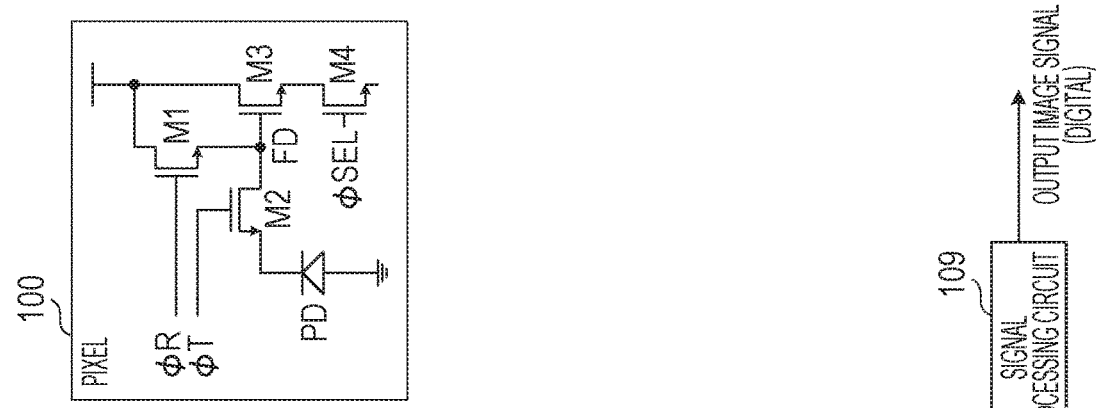
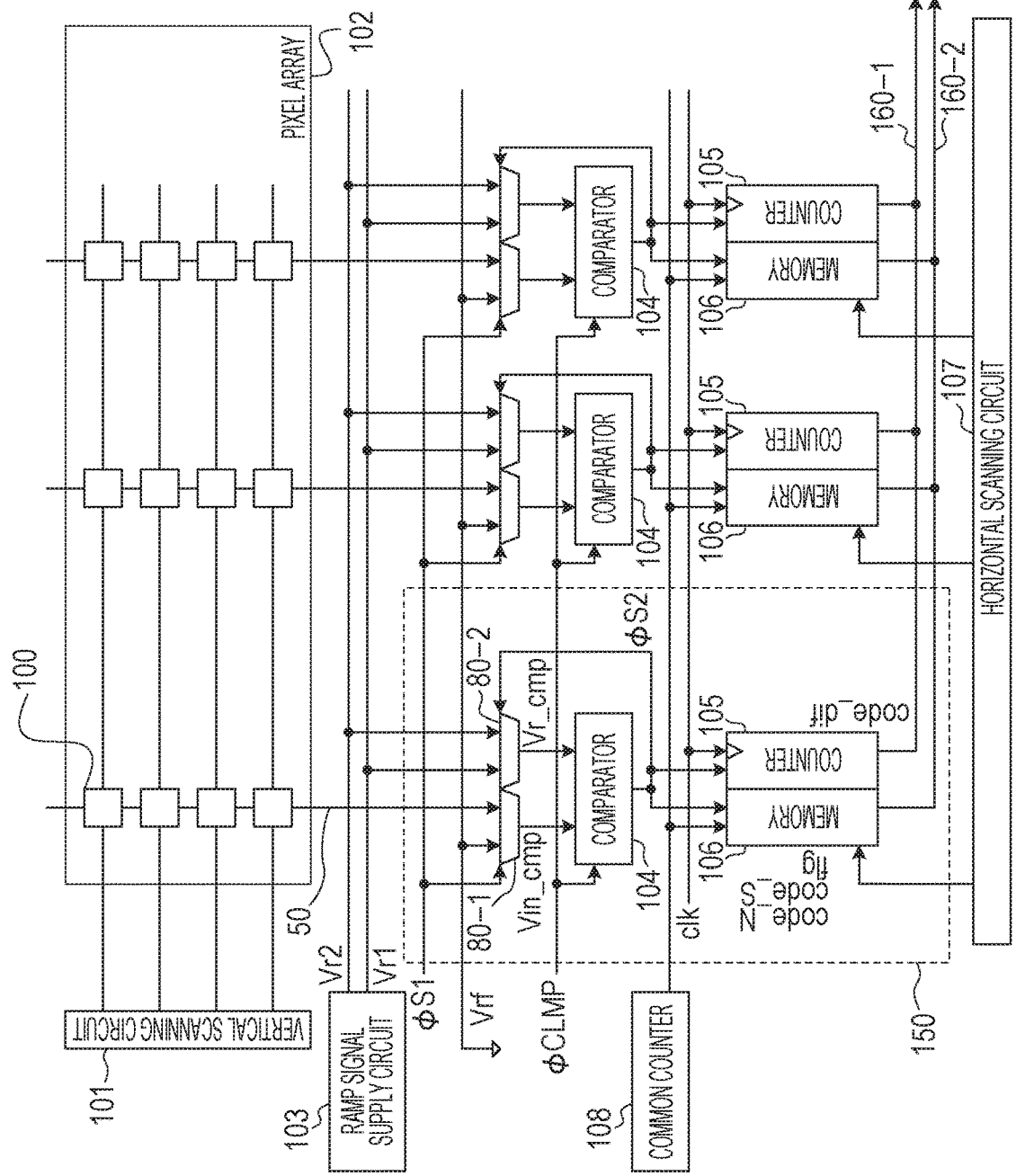

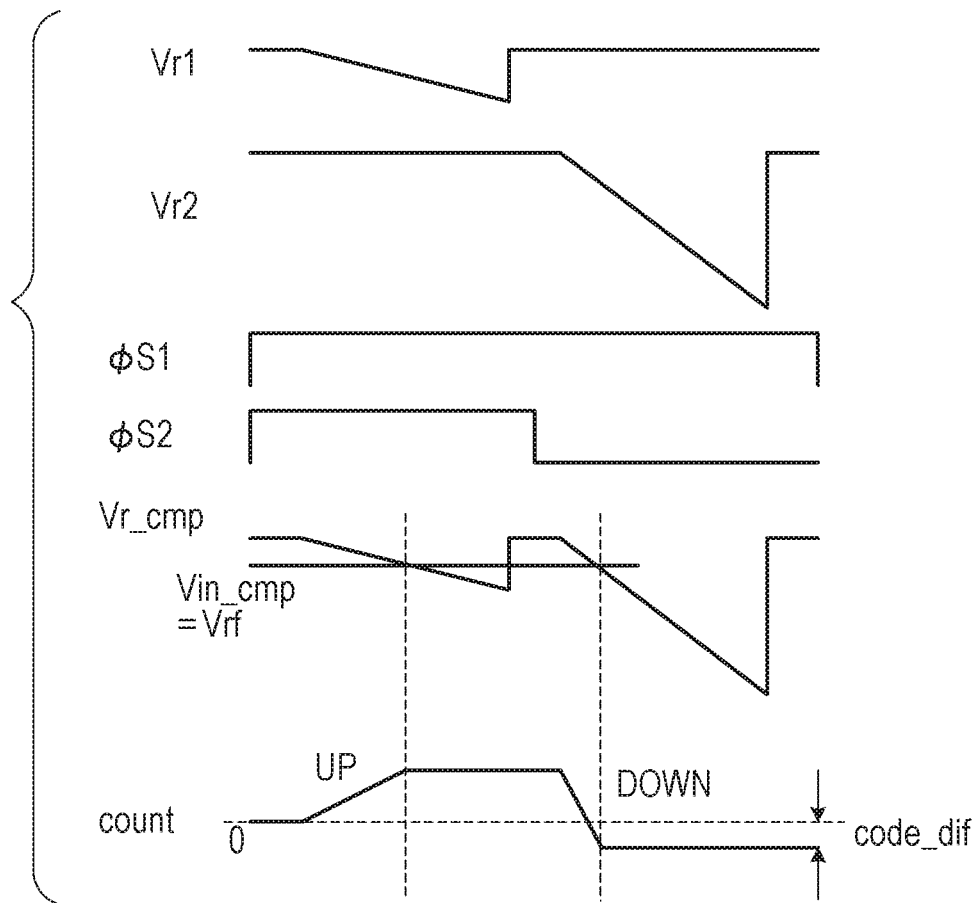
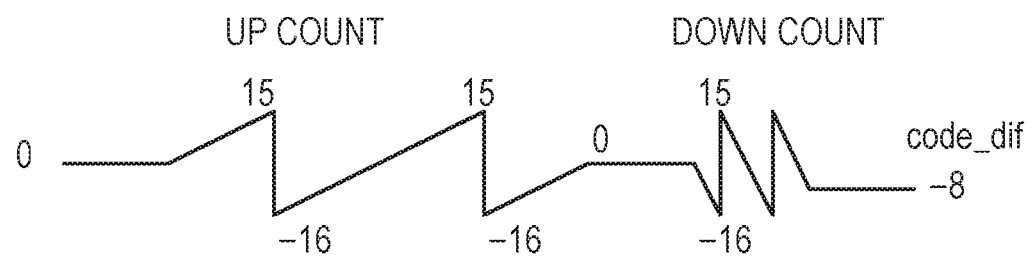

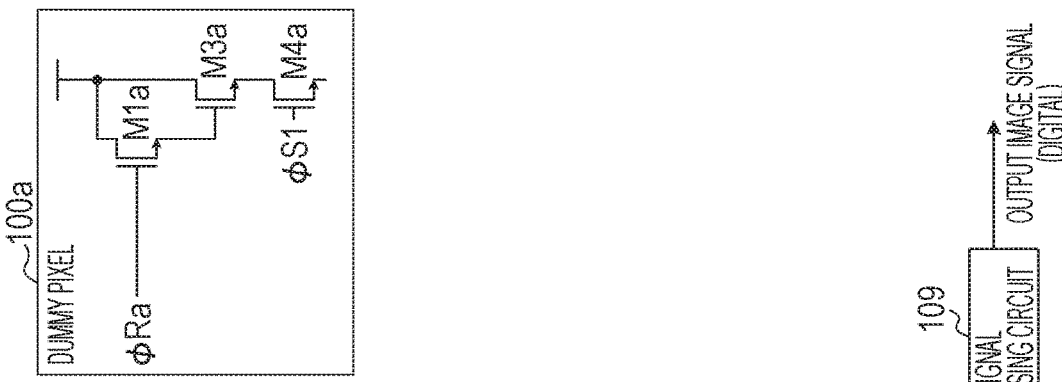
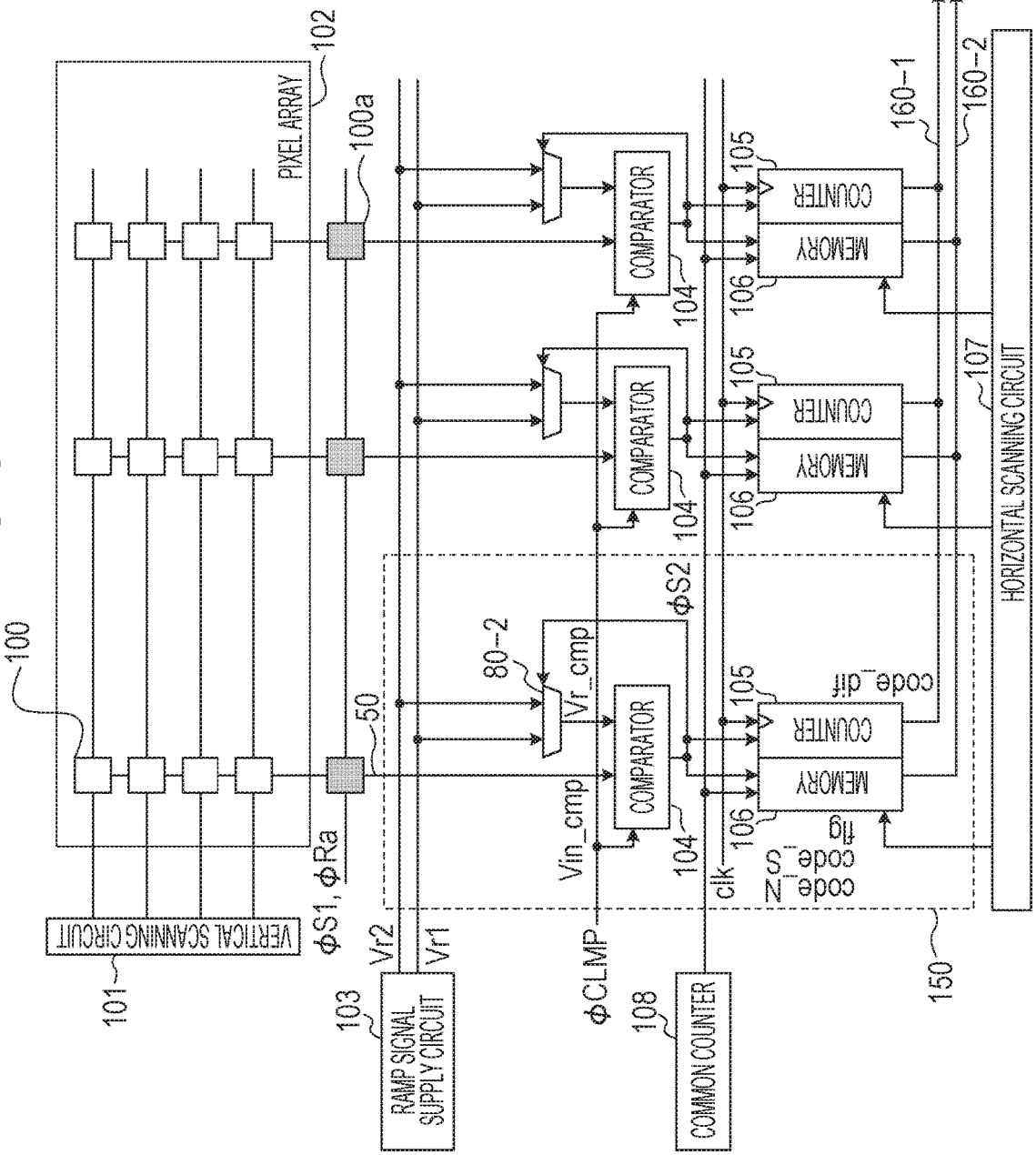

APPARATUS, SYSTEM, AND MOVING OBJECT

BACKGROUND OF THE INVENTION

Field of the Invention

The present disclosure relates to an apparatus, a system, and a moving object.

Description of the Related Art

A technology has been known which changes the rate of change of an electric potential of a ramp signal for use in an AD conversion based on the amplitude of a signal output from a pixel.

Japanese Patent Laid-Open No. 2014-140152 discloses a technology for correcting an error of a digital signal caused by an error between ramp signals having different rates of change of their electric potentials. The digital signal correction is performed by an output circuit to which digital signals are sequentially transferred from AD converting units of columns.

Furthermore, in recent years, increases of the number of pixels in an imaging apparatus and an increased frame rate have been demanded. A further increased number of pixels and a further increased frame rate may also increase the processing amount of signals in an output circuit to which digital signals are sequentially transferred from circuits of columns. The signal processing capability of such output circuits may possibly limit the performances of an imaging apparatus such as the number of pixels in and the frame rate of the imaging apparatus.

According to the technology disclosed in Japanese Patent Laid-Open No. 2014-140152, an output circuit to which signals are sequentially transferred from circuits of columns performs signal correction processing. This, however, may tighten the signal processing capability of the output circuit and may result in limited performances of an imaging apparatus such as the number of pixels in and the frame rate of the imaging apparatus.

SUMMARY OF THE INVENTION

According to an aspect of the embodiments, an apparatus includes a plurality of pixels, a plurality of circuits arranged correspondingly to the plurality of pixels, and an output line connected to the plurality of circuits. Each of the circuits generates a signal by converting an analog signal at a first conversion rate and a signal by converting, at a second conversion rate, the analog signal used for generating the signal converted at the first conversion rate. The circuit has a signal obtaining unit configured to obtain a difference signal corresponding to a difference between a signal converted at the first conversion rate and a signal converted at the second conversion rate.

Further features of the disclosure will become apparent from the following description of exemplary embodiments with reference to the attached drawings.

BRIEF DESCRIPTION OF THE DRAWINGS

FIGS. 1A and 1B are block diagrams illustrating a configuration of an imaging apparatus.

FIG. 4 is a timing chart illustrating operations to be performed by a counter in an AD converting unit.

FIG. 5 is a timing chart illustrating operations to be performed by the counter in the AD converting unit.

FIGS. 6A and 6B are block diagrams illustrating a configuration of the imaging apparatus.

DESCRIPTION OF THE EMBODIMENTS

Figure 2:
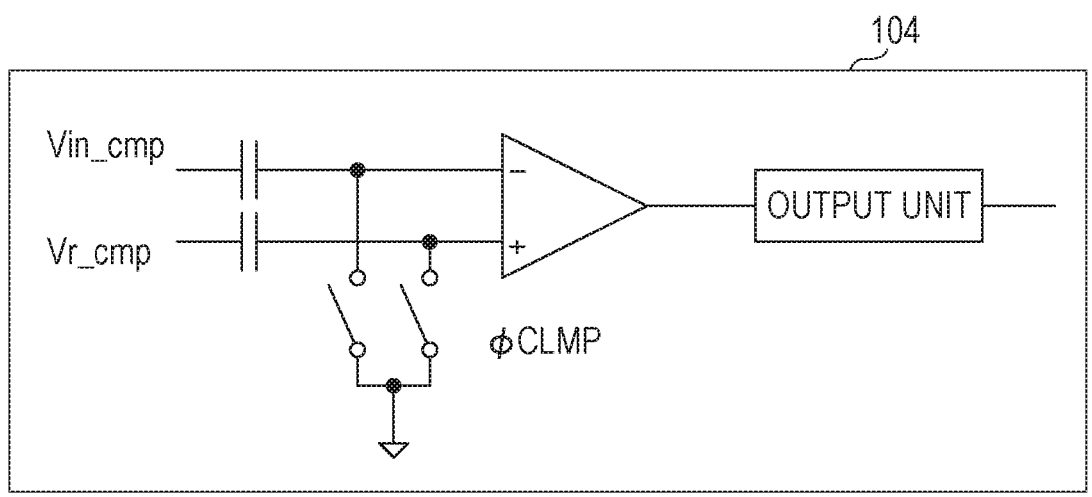
FIG. 2 is an equivalent circuit diagram of a comparator.

Imaging apparatuses according to embodiments will be described below with reference to drawings.

FIG. 1A is a block diagram illustrating an imaging apparatus according to a first embodiment of the present disclosure.

A pixel array 102 has a plurality of rows and a plurality of columns of pixels 100. A vertical scanning circuit 101 is configured to sequentially select a predetermined row of the pixel array 102 and cause the pixels 100 of the predetermined row to output signals.

Externally to the pixel array 102, a column circuit (AD converting unit 150) including a comparator 104 is provided for each of the columns of the pixels 100. An example will be described below in which one column circuit (AD converting unit 150) is provided for each one column of the pixels 100.

The pixels 100 and the corresponding AD converting unit 150 are connected through a vertical signal line 50.

The AD converting unit 150 has a first selector 80-1, a second selector 80-2, the comparator 104, a counter 105, and a memory 106. FIG. 1A illustrates signals φS1, φCLMP, and clk output from a control unit (not illustrated) included in the imaging apparatus. The control unit is typically a timing generator.

The signal φS1 is input to the first selector 80-1. The first selector 80-1 receives signals output from the pixels 100 to the vertical signal line 50 and a signal Vrf. The first selector 80-1 selectively outputs one of the signals from the pixels 100 and the signal Vrf as a signal Vin_cmp to the comparator 104 based on whether the signal level of the signal φS1 is a High level or a Low level.

The signal φS2 is an output signal from the comparator 104 or a signal to be controlled by the control unit, not illustrated. The signal φS2 is output to the second selector 80-2. The second selector 80-2 outputs one of a ramp signal Vr1 and a ramp signal Vr2 output from a ramp signal supply circuit 103 as a signal Vr_cmp to the comparator 104 based on the signal level of the signal φS2.

A common counter 108 outputs a count signal to the memory 106 in the AD converting unit 150 for each column.

The memory 106 receives an output signal from the comparator 104. The memory 106 holds a signal code_N, a signal code_S, and a signal flg, which will be described below.

The counter 105 receives a signal clk being a clock signal and an output signal from the comparator 104. The counter 105 holds a signal code_dif, which will be described below.

A horizontal scanning circuit 107 is configured to perform a control for sequentially reading digital signals from the counters 105 and the memories 106 in the AD converting units 150 of columns. The counters 105 in the AD converting units 150 of columns are connected to an output line 160-1. The memories 106 of columns are connected to an output line 160-2. A signal processing circuit 109 is configured to perform digital signal processing including correlated double sampling processing by using digital signals read out from the counters 105 and the memories 106 of columns. The signal processing circuit 109 outputs a signal generated by performing digital signal processing as an image signal to an apparatus external to the imaging apparatus.

FIG. 1B is an equivalent circuit diagram of the pixel 100. The pixel 100 has a photodiode PD which is a photoelectric converting unit. The pixel 100 further has a reset transistor M1, a transfer transistor M2, an amplification transistor M3, and a selection transistor M4. A signal φR, a signal φT, and a signal φSEL are output from the vertical scanning circuit 101 illustrated in FIG. 1A. One main node of the reset transistor M1, one main node of the transfer transistor M2, and an input node of the amplification transistor M3 are connected to a floating diffusion portion FD.

FIG. 2 is an equivalent circuit diagram of the comparator 104 illustrated in FIG. 1A. The comparator 104 according to this embodiment has an auto-zero clamp function. A differential amplifier has a capacitive coupling input unit. The differential amplifier has an input terminal to be reset to a common reset potential when the control unit changes the signal φCLMP to a High level. Thus, the comparator 104 undergoes the auto-zero clamp.

Figure 3:
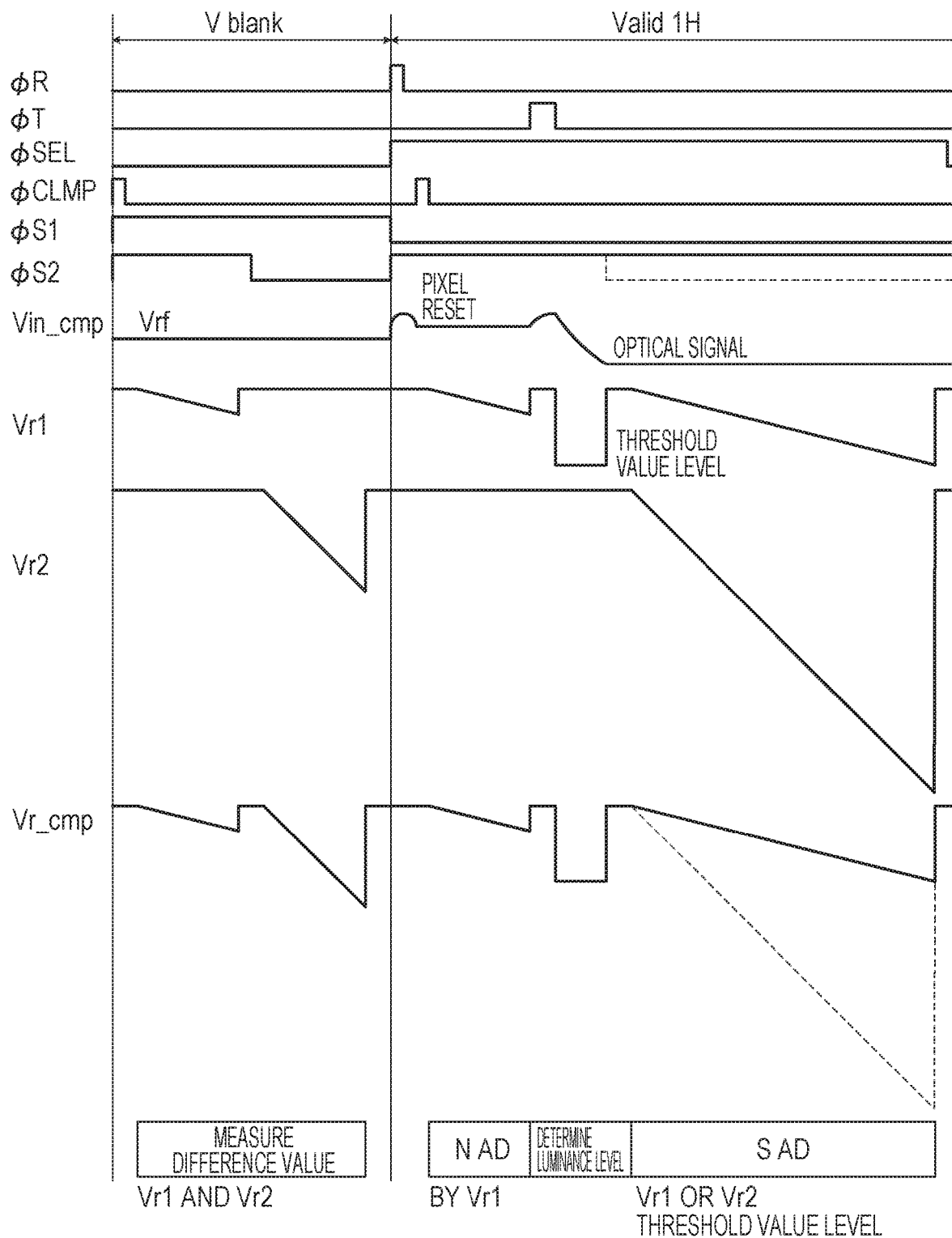
FIG. 3 is a timing chart illustrating operations to be performed by the imaging apparatus.

FIG. 3 is a timing chart illustrating operations to be performed by the imaging apparatus illustrated in FIG. 1A. FIG. 3 illustrates signals corresponding to the signals illustrated in FIGS. 1A and 1B.

According to this embodiment, a voltage change against a time of a second ramp signal Vr2 is four times as large as that of the first ramp signal Vr1.

Referring to FIG. 3, a period V blank is a vertical blanking period. The vertical blanking period is a period when no signal is read from the pixel 100. A period Valid 1H is a period when a signal is read from the pixel 100 and is one horizontal period (one row reading period). An operation in one horizontal period may be repeated a number of times equal to the number of rows in the pixel array to obtain signals for one screen, though not illustrated. When the signal φR, the signal φT, the signal φSEL and the signal φCLMP are changed to a High level, switches which receive the signals are turned on.

During the period V blank, the control unit changes the signal φS1 to a High level. Thus, the first selector 80-1 outputs the signal Vrf as a signal Vin_cmp. At the same time, the control unit changes the signal φS2 to a High level. Thus, the second selector 80-2 outputs the first ramp signal Vr1 as a signal Vr_cmp.

The control unit changes the signal φCLMP to a High level. Thus, the comparator 104 undergoes auto-zero clamp. After that, the control unit changes the signal φCLMP to a Low level.

The ramp signal supply circuit 103 starts a change with passage of time of the electric potential of the first ramp signal Vr1. The comparator 104 compares the first ramp signal Vr1 and the signal Vin_cmp with respect to their magnitude relationship and outputs a comparison result signal representing a result of the comparison.

Operations to be performed by the counter 105 will be described briefly here and will be described in detail below with reference to FIG. 4. The counter 105 starts counting the signal clk in response to the start of the change of the electric potential of the first ramp signal Vr1. Here, the counter 105 performs an up-count operation which counts the signal clk in a direction (first direction) of an increase of the count value.

In response to the change of the magnitude relationship between the first ramp signal Vr1 and the signal Vin_cmp, the signal level of the comparison result signal output from the comparator 104 changes. In response to the change of the signal level of the comparison result signal, the counter 105 stops counting the signal clk. Thus, the counter 105 obtains a first digital signal corresponding to the signal Vrf.

Next, the control unit changes the signal level of the signal φS2 to a Low level. Thus, the second selector 80-2 outputs the second ramp signal Vr2 as a signal Vr_cmp.

The ramp signal supply circuit 103 starts a change with passage of time of the electric potential of the second ramp signal Vr2. The comparator 104 compares the second ramp signal Vr2 and the signal Vin_cmp with respect to their magnitude relationship and outputs a comparison result signal representing the result of the comparison.

The counter 105 starts counting the signal clk in response to the start of the change of the electric potential of the second ramp signal Vr2. At this time, the counter 105 performs a down-count operation which counts the signal clk in a direction of a decrease of the count value (second direction opposite to the first direction) starting from a digital value of the first digital signal.

In response to the change of the magnitude relationship between the second ramp signal Vr2 and the signal Vin_cmp, the signal level of the comparison result signal output from the comparator 104 changes. In response to the change of the signal level of the comparison result signal, the counter 105 stops counting the signal clk. Thus, the counter 105 obtains a second digital signal corresponding to the signal Vrf. The second digital signal will be called a signal code_dif. The signal code_dif is a difference signal between a digital signal corresponding to the first ramp signal Vr1 and the signal Vrf and a digital signal corresponding to the second ramp signal Vr2 and the signal Vrf. The signal code_dif is held in the counter 105 in the AD converting unit 150 for each column. The counter 105 is a signal obtaining unit configured to obtain a correction value (second digital signal) being a difference between a digital signal (first digital signal) corresponding to the signal Vrf and the first ramp signal Vr1 being analog signals and a digital signal corresponding to the signal Vrf and the second ramp signal Vr2.

With reference to FIG. 4, a method for obtaining the signal code_dif through up/down-count operations performed by the counter 105 will be described in detail.

The count value of the counter 105 is set to 0. The counter 105 starts up-counting from start of a change of the potential of the first ramp signal Vr1. In response to the change of the comparison result signal depending on the change of the magnitude relationship between the signal Vr_cmp and the signal Vin_cmp, the counter 105 stops counting the signal clk. At this time, the counter 105 obtains the first digital signal.

Next, in response to the start of the change of the potential of the second ramp signal Vr2, the counter 105 starts down-counting. The counter 105 starts the down-counting from the first digital signal. The down-counting is performed such that the change amount of the count value per unit time period can be larger than that of the up-counting. This is because the second ramp signal Vr2 has a second rate of change four times as large as the first rate of change, compared with the first ramp signal Vr1 having the electric potential changing at the first rate of change. The AD conversion using the second ramp signal Vr2 is a ¼ AD conversion gain of that of the AD conversion using the first ramp signal Vr1. In other words, the column circuit (AD converting unit 150) has a ¼ input signal conversion rate using the second ramp signal Vr2 of that using the first ramp signal Vr1. In order to reduce the difference between the AD conversion gains, the down-counting is performed such that the change amount of the count value per unit time period can be larger than that of the up-counting. The down-counting may be performed such that the change amount of the count value per unit time period can be four times as large as the change amount of the count value per unit time period when the up-counting is performed. More specifically, it may be achieved by increasing the clock frequency of the signal clk in the down-counting to four times of the clock frequency of the signal clk in the up-counting. Thus, the counter 105 can obtain the signal code_dif.

During the period Valid 1H, the control unit changes the signal φS1 to a Low level. Thus, the first selector 80-1 outputs the signal to be output from the pixel 100 to the vertical signal line 50 as a signal Vin_cmp.

During the period Valid 1H, the vertical scanning circuit 101 reads out signals from the pixels 100 of a predetermined one row (hereinafter, selected row) of the pixel array 102. The vertical scanning circuit 101 changes the signal level of the signal φSEL to be output to the pixels 100 of the selected row to a High level. This turns on the selection transistors M4 of the pixels 100 of the selected row. Thus, the amplification transistors M3 in the pixels 100 of the selected row are connected to the vertical signal line 50 through the selection transistors M4.

Then, the vertical scanning circuit 101 changes the signal level of the signal φR to be output to the pixels 100 of the selected row to a High level. This resets the floating diffusion portions FD in the pixels 100 of the selected row to a predetermined electric potential.

The vertical scanning circuit 101 changes the signal level of the signal φR to a Low level. A signal to be output from the amplification transistors M3 to the vertical signal line 50 through the selection transistors M4 will be called a pixel reset signal.

The control unit changes the signal level of the signal φS2 to a High level. Here, the control unit causes the signal φS2 to have a High level. Thus, the second selector 80-2 outputs the first ramp signal Vr1 as a signal Vr_cmp.

The control unit changes the signal level of the signal CLMP to a High level. Thus, the comparator 104 undergoes auto-zero clamp. The control unit changes the signal level of the signal φCLMP to a Low level.

Next, the AD converting unit 150 performs an AD conversion on the pixel reset signal. Referring to FIG. 3, the period in which the AD conversion is performed is called "N AD". Hereinafter, the period will be called "N AD".

The ramp signal supply circuit 103 starts a change with passage of time of the electric potential of the first ramp signal Vr1. The comparator 104 compares the first ramp signal Vr1 and the pixel reset signal with respect to their magnitude relationship and outputs a comparison result signal representing the result of the comparison.

The common counter 108 starts counting the signal clk in response to the start of the change of the electric potential of the first ramp signal Vr1. The common counter 108 up-counts the signal clk.

In response to a change of the magnitude relationship between the first ramp signal Vr1 and the pixel reset signal, the signal level of the comparison result signal output from the comparator 104 changes. In response to the change of the signal level of the comparison result signal, the memory 106 holds the count signal output from the common counter 108. Thus, the counter 105 obtains a third digital signal that is a digital signal corresponding to the pixel reset signal. The digital signal is called a signal code_N.

Next, the vertical scanning circuit 101 changes the signal level of the signal φT of the selected row to a High level and then to a Low level. Thus, the electric charges accumulated in the photodiode PD are transferred to the floating diffusion portion FD. Therefore, the amplification transistor M3 outputs a signal based on the electric charges accumulated in the photodiode PD through the selection transistor M4. This signal will be called an optical signal.

The comparator 104 determines whether the optical signal has an amplitude higher than a threshold value level or not. The ramp signal supply circuit 103 sets the electric potential of the first ramp signal Vr1 to the threshold value level. The control unit keeps the signal φS2 at a High level. Thus, the second selector 80-2 outputs the threshold value level as a signal Vr_cmp. The comparator 104 compares the threshold value level and the optical signal. The control unit changes the control over the signal φS2 from the control by the control unit to the control based on the output from the comparator 104. In a case where the comparator 104 determines that the optical signal has an amplitude higher than the threshold value level, the signal level of the signal φS2 is changed to a Low level. In a case where the comparator 104 determines that the optical signal has an amplitude lower than the threshold value level on the other hand, the signal level of the signal φS2 is changed to a High level.

In a Case where the Optical Signal has an Amplitude Lower than the Threshold Value Level:

A determination result flag flg=0 that is a comparison result between the threshold value level and the optical signal is held in the memory 106.

Next, the AD converting unit 150 performs an AD conversion on the optical signal. Referring to FIG. 3, the period in which the AD conversion is performed on the optical signal is called "S AD". Hereinafter, the period will be called "S AD".

During the period S AD, the signal level of the signal φS2 is changed to a High level based on the comparison result between the threshold value level and the optical signal, as described above.

Therefore, the second selector 80-2 outputs the first ramp signal Vr1 to the comparator 104 as a signal Vr_cmp. The subsequent operations are the same as the operations to be performed in the period N AD. As a result of the AD conversion, the memory 106 obtains a fourth digital signal that is a digital signal corresponding to the optical signal. The digital signal will be called a signal code_S.

In a Case where the Optical Signal has an Amplitude Higher than the Threshold Value Level:

A determination result flag flg=1 that is a comparison result between the threshold value level and the optical signal is held in the memory 106.

Next, the AD converting unit 150 performs AD conversion on the optical signal.

During the period S AD, the signal level of the signal φS2 is changed to a Low level based on the comparison result between the threshold value level and the optical signal, as described above.

Therefore, the second selector 80-2 outputs the second ramp signal Vr2 to the comparator 104 as a signal Vr_cmp. The subsequent operations are the same as the operations to be performed in the period N AD. As a result of the AD conversion, the memory 106 obtains the signal code_S.

The signal processing circuit 109 processes digital signals output from the AD converting units 150 of columns. The processing includes digital correlated double sampling for obtaining a difference between the signal code_S and the signal code_N. The signal code_S obtained by using the first ramp signal Vr1 and the signal code_S obtained by using the second ramp signal Vr2 have an AD conversion gain difference due to a difference in rate of change between the electric potentials of the ramp signals. In order to reduce the AD conversion gain difference, the signal processing circuit 109 applies a four-time gain to the signal code_S obtained by using the second ramp signal Vr2. The processing is implemented by performing a bit shift which shifts the signal code_S obtained by using the second ramp signal Vr2 to higher order by 2 bits. Then, the signal processing circuit 109 performs processing for obtaining a difference between a fifth digital signal that is a difference between the signal code_N and the signal code_dif and the signal code_S. This processing may compensate for the digital correlated double sampling processing and an error in the AD conversion due to use of two ramp signals having different rates of change in electric potential.

More specifically, the signal processing circuit 109 performs the digital correlated double sampling processing in the following manner.

If flg=0 code_out=code_$S$–code_$N$

If flg=1 code_out=code_$S$×4–(code_$N$–code_dif)

In this manner, the imaging apparatus according to this embodiment performs processing for compensating for the digital correlated double sampling processing and an error in the AD conversion by using two ramp signals having different electric potential rates of change. Thus, the imaging apparatus according to this embodiment can obtain a higher-quality image signal.

In the imaging apparatus according to this embodiment, the AD converting unit 150 of each column obtains the signal code_dif that is a correction value. This can reduce the signal processing amount of the signal processing circuit 109 compared with a case where the signal processing circuit 109 generates a correction value for the AD converting unit 150 of each column. Thus, improved performance such as an increased number of pixels and an increased frame rate of an imaging apparatus can be easily achieved.

According to this embodiment, one AD converting unit 150 is provided for pixels 100 of one column, for example. This embodiment is not limited thereto, but one AD converting unit 150 may be provided for pixels 100 of a plurality of columns. Alternatively, a plurality of AD converting units 150 may be provided for pixels 100 of one column.

According to this embodiment, the second ramp signal has a rate of change of the electric potential four times as large as that of the first ramp signal. This embodiment is not limited to the example but may apply other rates. For facilitating the signal processing by the signal processing circuit 109, the slope ratio of the ramp signals may be raised to the nth-power of 2. The slope ratio may be raised to the nth-power of 2 so that the processing for multiplying the signal code_S by a gain to be performed by the signal processing circuit 109 can be implemented by bit shifting.

According to this embodiment, the ramp signals change their electric potentials in a slopewise manner, for example. This embodiment is not limited to the example, but the ramp signals may change their electric potentials in a stepwise manner. Signals having their electric potentials changing in a stepwise manner are also included in the same category as that of the ramp signals having their electric potential changing with passage of time.

According to this embodiment, the ramp signal supply circuit 103 provided on the semiconductor substrate having the imaging apparatus thereon generates ramp signals. A circuit which generates ramp signals having electric potentials changing with passage of time may be provided externally to the semiconductor substrate having the imaging apparatus thereon. In this case, the imaging apparatus has a ramp signal supply circuit (such as a buffer circuit) for outputting an externally input ramp signal to the AD converting unit 150 of each column.

According to this embodiment, the AD converting unit 150 for each column obtains the signal code_dif that is a correction value. In another example, the AD converting units 150 for a plurality of columns may operate as one block to obtain one signal code_dif. In this case, the signals code_dif generated by the AD converting units 150 for the plurality of columns may be averaged by the signal processing circuit 109. Alternatively, a signal code_dif generated by one AD converting unit 150 of AD converting units 150 for a plurality of columns may also be used as a correction value for each of the AD converting units 150 for the plurality of columns. In this case, some AD converting units 150 of the AD converting units 150 for a plurality of columns may have a counter 105 being a signal holding unit.

According to this embodiment, in order to obtain the signal code_dif, an AD conversion using the first ramp signal Vr1 is performed before an AD conversion using the second ramp signal Vr2 is performed. In another example, the AD conversion using the second ramp signal Vr2 may be performed before the AD conversion using the first ramp signal Vr1 is performed.

According to this embodiment, a signal code_dif is obtained prior to the readout of signals from the pixels 100 of each column. In another example, a signal code_dif may be obtained once during the readout of signals from the pixels 100 of each column. The counter 105 may obtain the signal code_dif during a period (one frame period) from readout of signals from the pixels 100 of a predetermined row to the next readout of signals from the pixels 100 of the predetermined row. The counter 105 may obtain a signal code_dif when the imaging apparatus is powered on.

Other operations to be performed by the counter 105 for obtaining a signal code_dif will be described below.

FIG. 5 illustrates a case where the counter 105 is a continuity counter. For measuring an error in the AD conversion using the first ramp signal Vr1 and in the AD conversion using the second ramp signal Vr2, the counter 105 may not necessarily have a bit count for the full-scale AD conversions. The possible range of the error can be estimated by arithmetic processing if digital signals with a certain degree of accuracy are obtained.

Referring to FIG. 5, the counter 105 is a counter, which generates a count signal having 4 bits signals and a code indicating negative or positive. The counter 105 is a continuity counter which does not clip an overflow and an underflow. An equal number of rounds occur both in the up-counting and the down-counting during the periods for obtaining the first digital signal and the second digital signal as illustrated in FIG. 3. Also in this case, the difference value code_dif can be correctly obtained. With the configuration of the counter 105 illustrated in FIG. 5, the bit count can be reduced, compared with the configuration of the counter 105 which performs the operations illustrated in FIG. 4. Therefore, the circuit area of the counter 105 can also be reduced.

Second Embodiment

An imaging apparatus according to a second embodiment will be described mainly with respect to differences from the first embodiment.

FIG. 6A is a block diagram illustrating a configuration of an imaging apparatus according to a second embodiment. The imaging apparatus according to this embodiment has a configuration different from the one illustrated in FIG. 1A in that the first selector 80-1 is omitted and that the output from a dummy pixel 100a is selectable with a signal φS1 instead of the signal Vrf.

FIG. 6B is an equivalent circuit diagram of the dummy pixel 100a. The dummy pixel 100a has a reset transistor M1a and a dummy pixel transistor M3a to be controlled by a signal φRa output from the vertical scanning circuit 101 and a selection transistor M4a to be controlled by the signal φS1.

Figure 7:
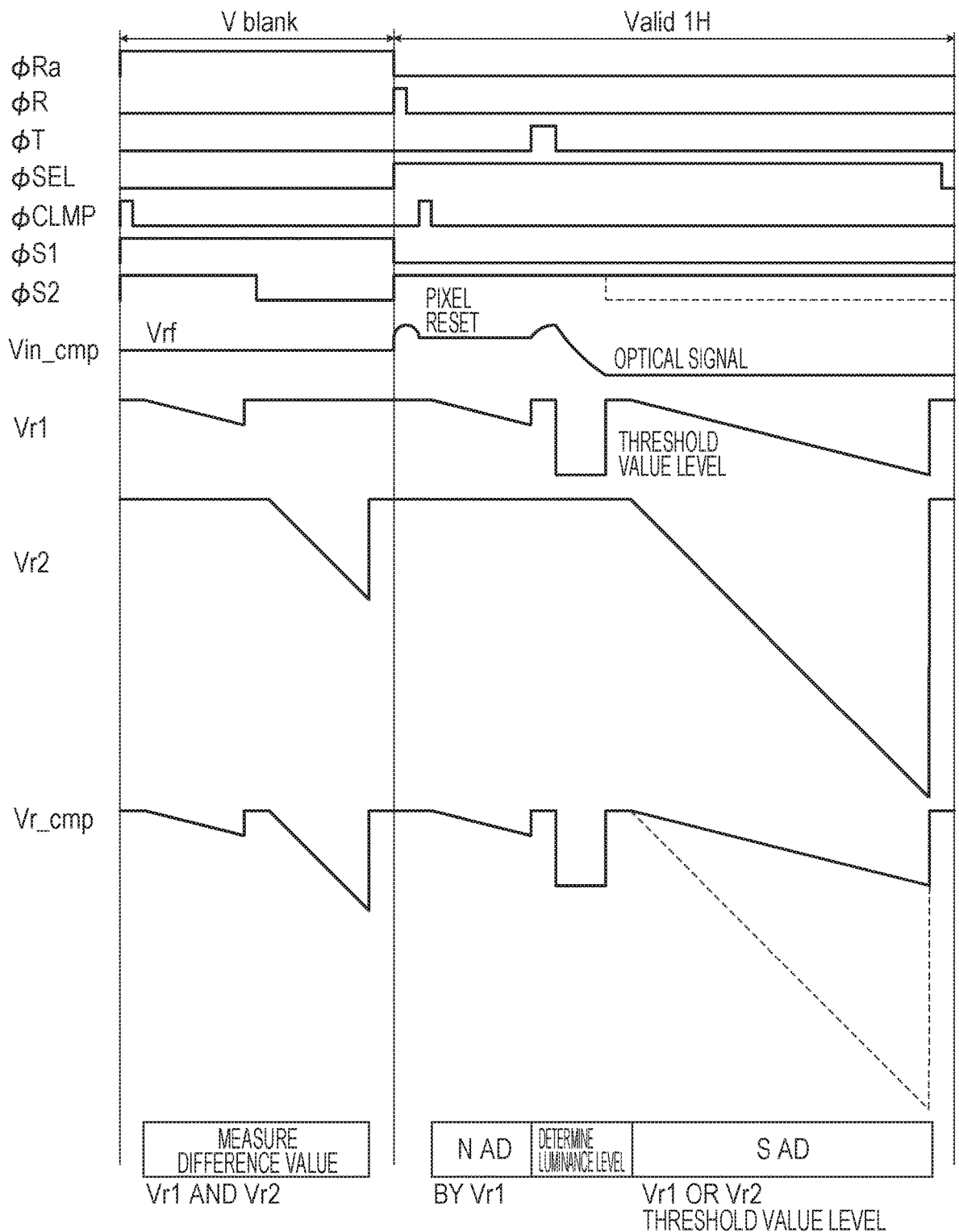
FIG. 7 is a timing chart illustrating operations to be performed by the imaging apparatus.

FIG. 7 is a timing chart illustrating operations to be performed by the imaging apparatus illustrated in FIG. 6A.

The timing chart in FIG. 7 is different from the timing chart illustrated in FIG. 3 in that a signal φRa is further given.

During a period V blank, the signal levels of the signals φS1 and φRa are a High level. A signal corresponding to a reset level is output from the dummy pixel 100a. By using the signal, the AD converting unit 150 for each column obtains a difference signal code_dif by performing the same AD conversion operation as that of the first embodiment. The other operations are the same as those of the first embodiment.

Having described the example using a dummy pixel, an analog input signal for obtaining a difference signal code_dif for each column may be other arbitrary signals according to the present disclosure. It is not intended that the present disclosure is limited by the type of the analog input signal.

Third Embodiment

A third embodiment will be described mainly with respect to differences from the first embodiment. An imaging apparatus according to this embodiment is different from the first embodiment in that the AD converting unit 150 includes an infinite impulse response (IIR) filter 112 that is a digital low pass filter circuit and a difference memory 106-1.

Figure 8:
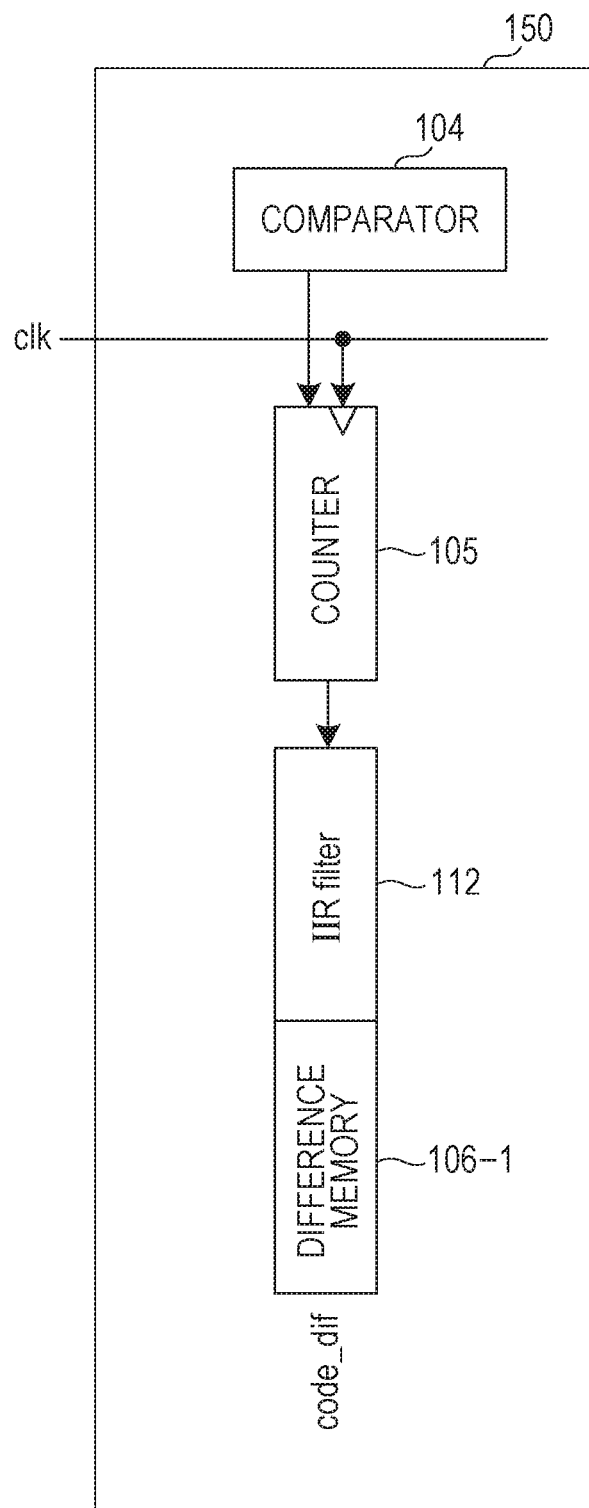
FIG. 8 is a block diagram illustrating a configuration of the AD converting unit.

FIG. 8 is a block diagram illustrating the AD converting unit 150 according to this embodiment. The IIR filter 112 is configured to compare a signal code_dif obtained by the counter 105 with the signal code_dif obtained last time. The IIR filter 112 filters the signal code_dif and stores the result of the filtering in the difference memory 106-1.

According to this embodiment, an error due to noise occurring in a measurement of a difference value between the signals code_dif may possibly deteriorate the quality of the resulting image signal.

Even when noise is mixed to the obtained difference value and results in an error, the configuration of this embodiment can reduce an influence of the noise by performing the low pass filter processing by the IIR filter 112.

Fourth Embodiment

An imaging apparatus according to a fourth embodiment will be described with respect to differences from the first embodiment. The imaging apparatus according to the first embodiment obtains a signal code_S and a signal code_N by using a count signal output from the common counter 108 provided commonly for the AD converting units 150 of a plurality of columns. The imaging apparatus according to this embodiment is different from the imaging apparatus according to the first embodiment in that the signal code_S and the signal code_N are obtained by using a count signal output from the counter 105 provided in the AD converting unit 150 for each column.

Figure 9:
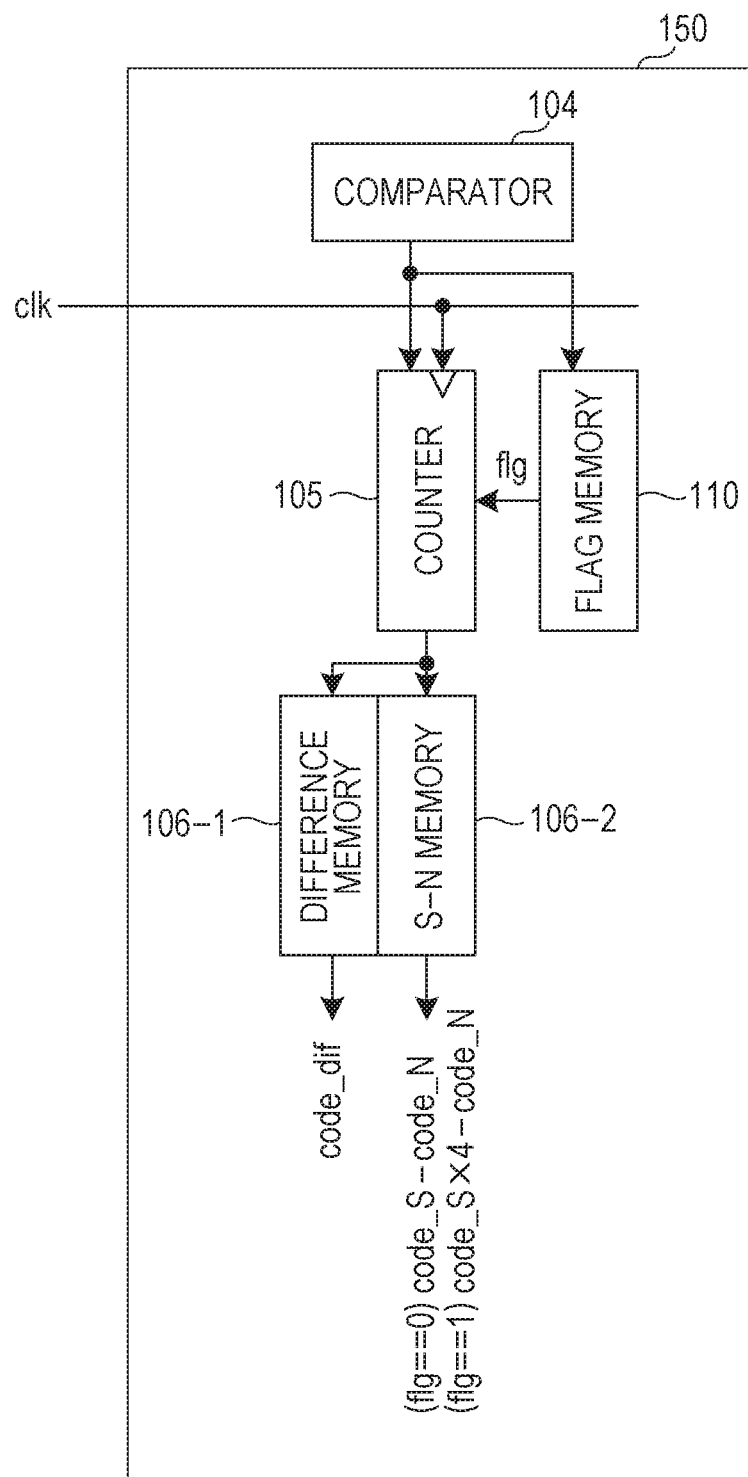
FIG. 9 is a block diagram illustrating a configuration of the AD converting unit.

FIG. 9 is a block diagram illustrating a configuration of the AD converting units 150 in the imaging apparatus according to this embodiment. Each of the AD converting units 150 has a flag memory 110, a difference memory 106-1, and an S-N memory 106-2.

The signal code_dif can be obtained by performing the same operations as those illustrated in FIG. 3 except that the count signal is output from the counter 105 instead of the common counter 108. The difference memory 106-1 is configured to hold the signal code_dif.

Figure 10:
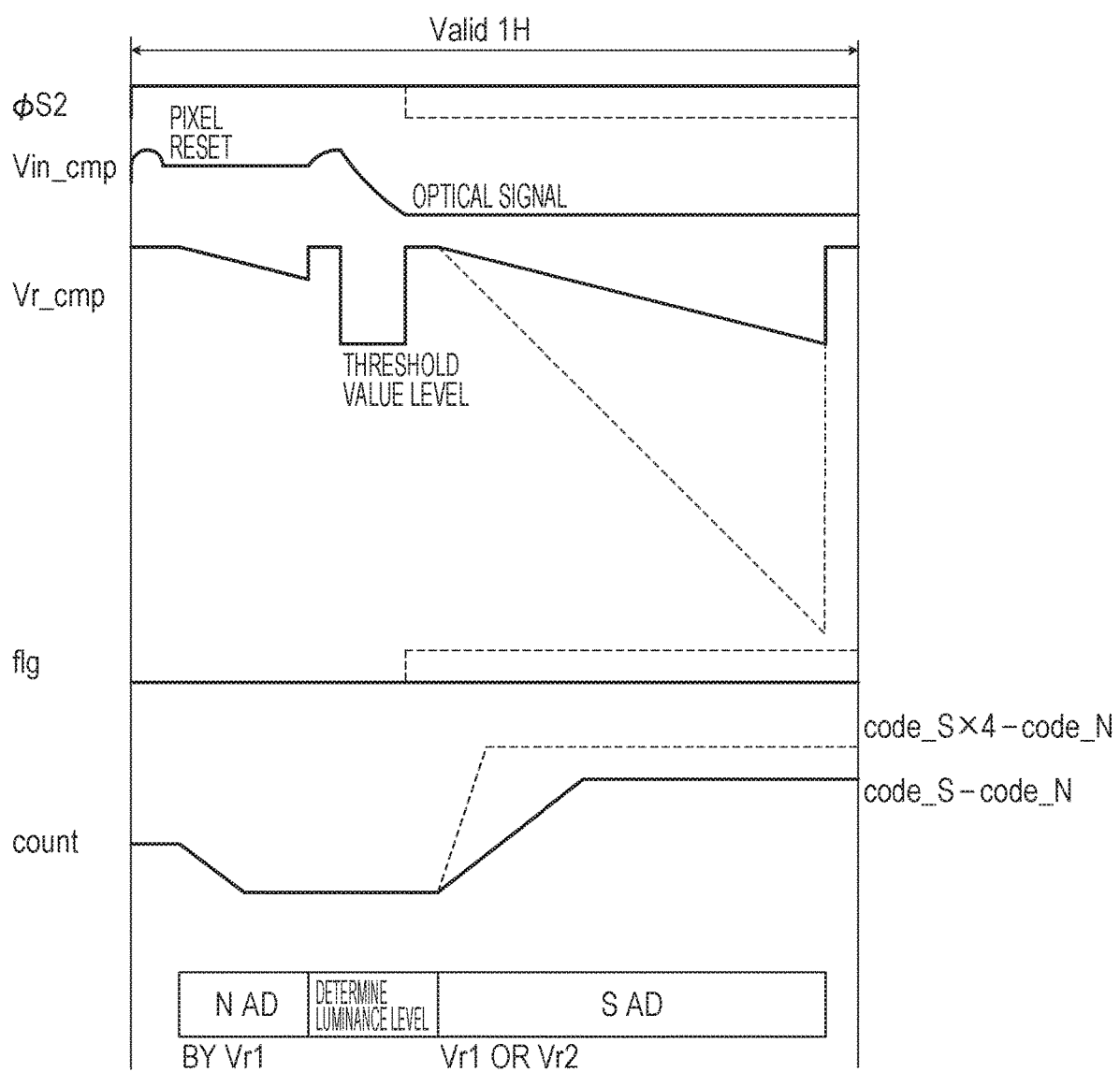
FIG. 10 is a timing chart illustrating operations to be performed by the imaging apparatus.

Operations to be performed during a period Valid 1H will be described with reference to FIG. 10.

The AD converting unit 150 performs an AD conversion during a period N AD by using a first ramp signal Vr1. Here, the counter 105 counts a signal clk by performing down-counting. In response to a change of the signal level of a comparison result signal, the S-N memory 106-2 holds the count signal output from the counter 105. Thus, the S-N memory 106-2 obtains a signal code_N that is a digital signal corresponding to a pixel reset signal.

After that, the comparator 104 compares an amplitude of the optical signal and a threshold value level. Based on the result of the comparison, one of a case indicated by the solid-line and a case indicated by the broken line illustrated in FIG. 10 is selected as a subsequent process to be performed by the AD converting unit 150.

In a Case where the Optical Signal has an Amplitude Lower than the Threshold Value Level:

A determination result flag that is a comparison result between the threshold value level and the optical signal is held in the flag memory 110. After that, during a period S AD, the counter 105 up-counts the signal clk based on the change amount per unit time period of the count signal regarded as being equal to that in the period N AD. The counter 105 defines the initial value for starting the up-counting as the value of the signal code_N. The rest is the same as those in the period N AD. Thus, the S-N memory 106-2 holds the signal code_S−code_N. Therefore, a digital signal corresponding to the optical signal with a reduced noise component can be obtained.

In a Case where the Optical Signal has an Amplitude Higher than the Threshold Value Level:

A determination result flag flg=1 that is a comparison result between the threshold value level and the optical signal is held in the flag memory 110. After that, during a period S AD, the counter 105 up-counts the signal clk based on the change amount per unit time period of the count signal regarded as being equal to four times as large as that in the period N AD. The counter 105 defines the initial value for starting the up-counting as the value of the signal code_N. The other points are the same as those in the period N AD. Thus, the S-N memory 106-2 holds the signal code_S×4−code_N in the S-N memory 106-2. Therefore, a digital signal corresponding to the optical signal with a reduced noise component can be obtained. The counter 105 defines the change amount of the count value per unit time period four times in the period S AD as large as that in the period N AD. Thus, the AD conversion using the second ramp signal Vr2 having a rate of change of electric potential four times as large as that of the first ramp signal Vr1 can result in a digital signal assumed to be obtained if the first ramp signal Vr1 is used. In other words, because the second ramp signal Vr2 has a gradient four times as large as that of the first ramp signal Vr1, the resulting AD conversion gain is ¼ times while a four-time AD conversion gain can be obtained by a counting operation. The product of the ¼ times and the four times result in an equal AD conversion gain both in the case using the second ramp signal Vr2 and in the case using the first ramp signal Vr1.

In this manner, the imaging apparatus including the counter 105, instead of the common counter 108, within the AD converting unit 150 can obtain a digital signal corresponding to the digital signal obtained according to the first embodiment. The imaging apparatus according to this embodiment also provides the same effect as that of the imaging apparatus according to the first embodiment.

Fifth Embodiment

An imaging apparatus according to a fifth embodiment will be described with respect to differences from the first embodiment. According to the first embodiment, the signal code_dif is obtained by using a count signal output from the counter 105 provided in the AD converting unit 150. This embodiment is different from the first embodiment in that the signal code_dif is obtained by using a count signal output from the common counter 108, instead of a count signal output from the counter 105.

Figure 11:
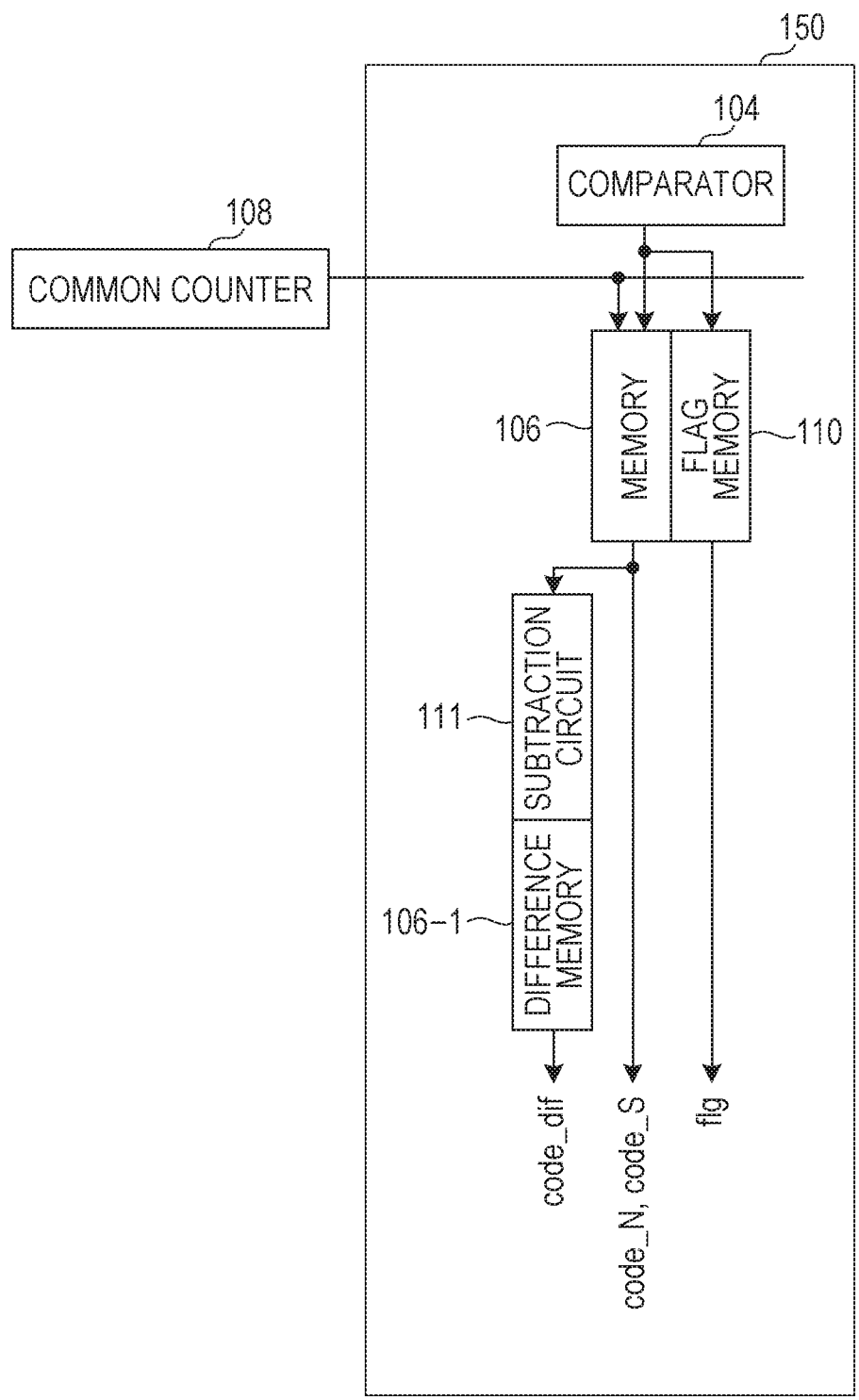
FIG. 11 is a block diagram illustrating a configuration of the AD converting unit.

FIG. 11 is a block diagram illustrating the AD converting unit 150 in the imaging apparatus according to this embodiment. The common counter 108 is commonly provided for each of the AD converting units 150 for a plurality of columns, like the first embodiment. Each of the AD converting units 150 has a flag memory 110, a subtraction circuit 111, and a difference memory 106-1.

Referring to FIG. 3, during the period V blank, the memory 106 holds a first digital signal obtained by performing an AD conversion on a signal vrf by using the first ramp signal Vr1. During the period V blank, the memory 106 holds a digital signal (sixth digital signal) obtained by performing an AD conversion on a signal vrf by using the second ramp signal Vr2. The subtraction circuit 111 obtains a digital signal representing a difference between the first digital signal and the sixth digital signal. In other words, the subtraction circuit 111 is a computing unit configured to obtain a digital signal representing a difference between the first digital signal held in the memory 106 and the sixth digital signal. The digital signal is a second digital signal corresponding to the signal code_dif according to the first embodiment. The difference memory 106-1 holds the signal code_dif obtained by the subtraction circuit 111.

The operations in the period Valid 1H are performed in the same manner as those in FIG. 3.

In a case where the AD converting unit 150 of each column does not have the counter 105, the imaging apparatus according to this embodiment can obtain a digital signal corresponding to the digital signal obtained according to the first embodiment. Thus, the imaging apparatus according to this embodiment can provide the same effect as that of the imaging apparatus according to the first embodiment. In The imaging apparatus according to this embodiment, the counter 105 in the AD converting unit 150 of each column can be omitted. Thus, the effect of reduction of power consumption can further be obtained, compared with the imaging apparatus according to the first embodiment. In a case where the subtraction circuit 111 has a smaller circuit size than that of the circuit size of the counter 105, the imaging apparatus according to this embodiment can provide an effect of reduction of the circuit area of the AD converting unit 150, compared with the imaging apparatus according to the first embodiment.

Sixth Embodiment

Figure 12:
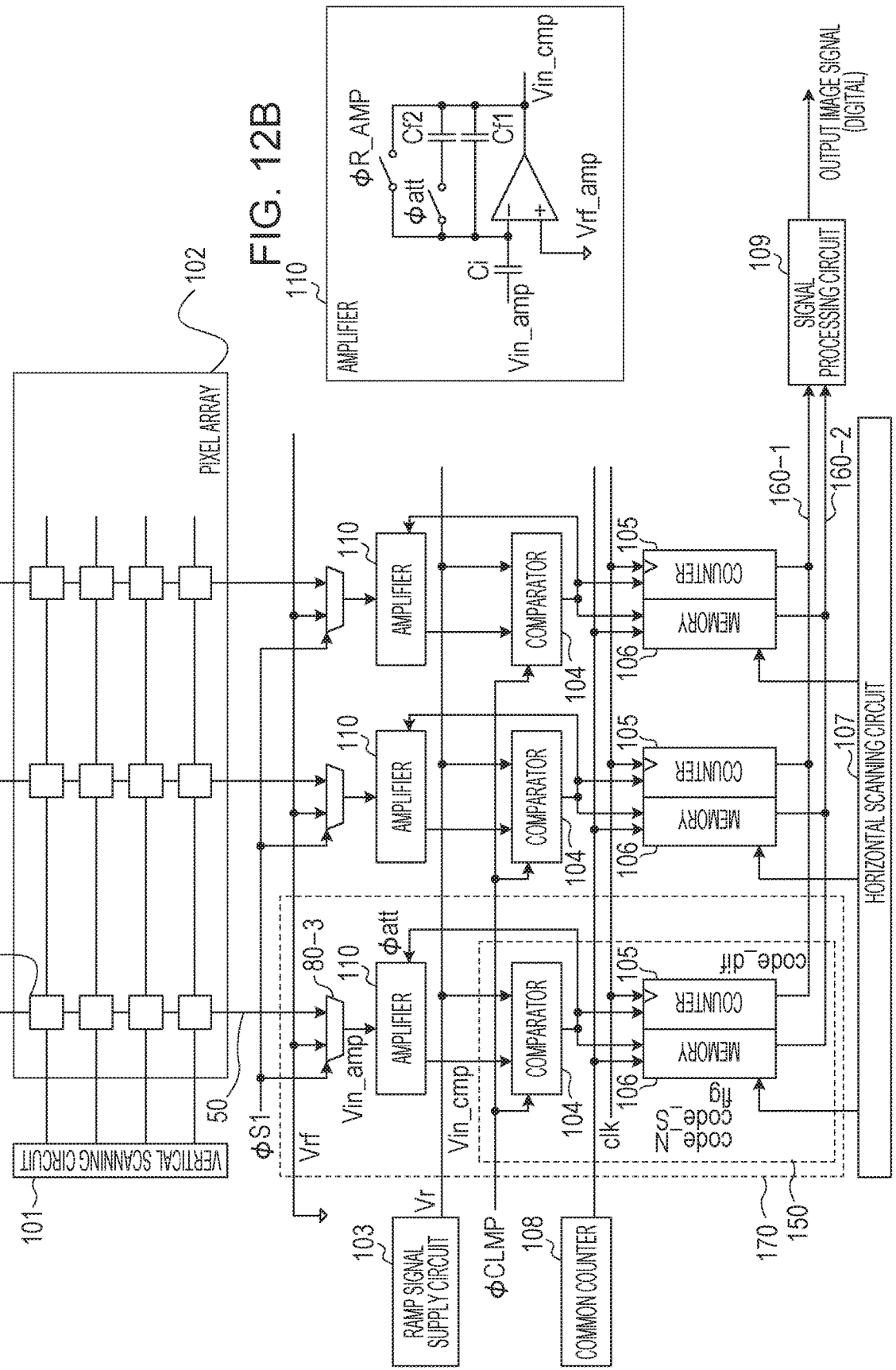
FIGS. 12A and 12B are block diagrams illustrating a configuration of the imaging apparatus.

FIGS. 12A and 12B are block diagrams illustrating an imaging apparatus according to a sixth embodiment of the present disclosure. The sixth embodiment further has amplifiers 110 each corresponding to an amplifying unit in addition to the configuration of the first embodiment. According to the first embodiment, the rate of change of a ramp signal is changed based on the amplitude of an optical signal. According to this embodiment, a ramp signal to be used for an AD conversion of an optical signal has one rate of change. The amplifier 110 is configured to output an amplified signal obtained by amplifying a signal input to the amplifier 110 at a predetermined amplification ratio.

A column circuit 170 includes the amplifier 110 and an AD converting unit 150. The amplifier 110 has an operational amplifier, capacitor elements Ci, Cf1, and Cf2, and switches to be controlled by signals φR_AMP and φatt. The amplifier 110 may have an amplification gain which can be set to a first amplification gain and a second amplification gain higher than the first amplification gain. Hereinafter, the first amplification gain and the second amplification gain will be called a low gain and a high gain, respectively. A state that the amplifier 110 is set to the low gain will be called a low gain state, and a state that the amplifier 110 is set to the high gain will be called a high gain state. The conversion rate of the column circuit is changed based on the gain of the amplifier 110. The amplifier 110 has an input connected to a vertical signal line or a signal Vrf through a selector 80-3. An output of the amplifier 110 and a ramp signal Vr are input to the comparator 104.

Figure 13:
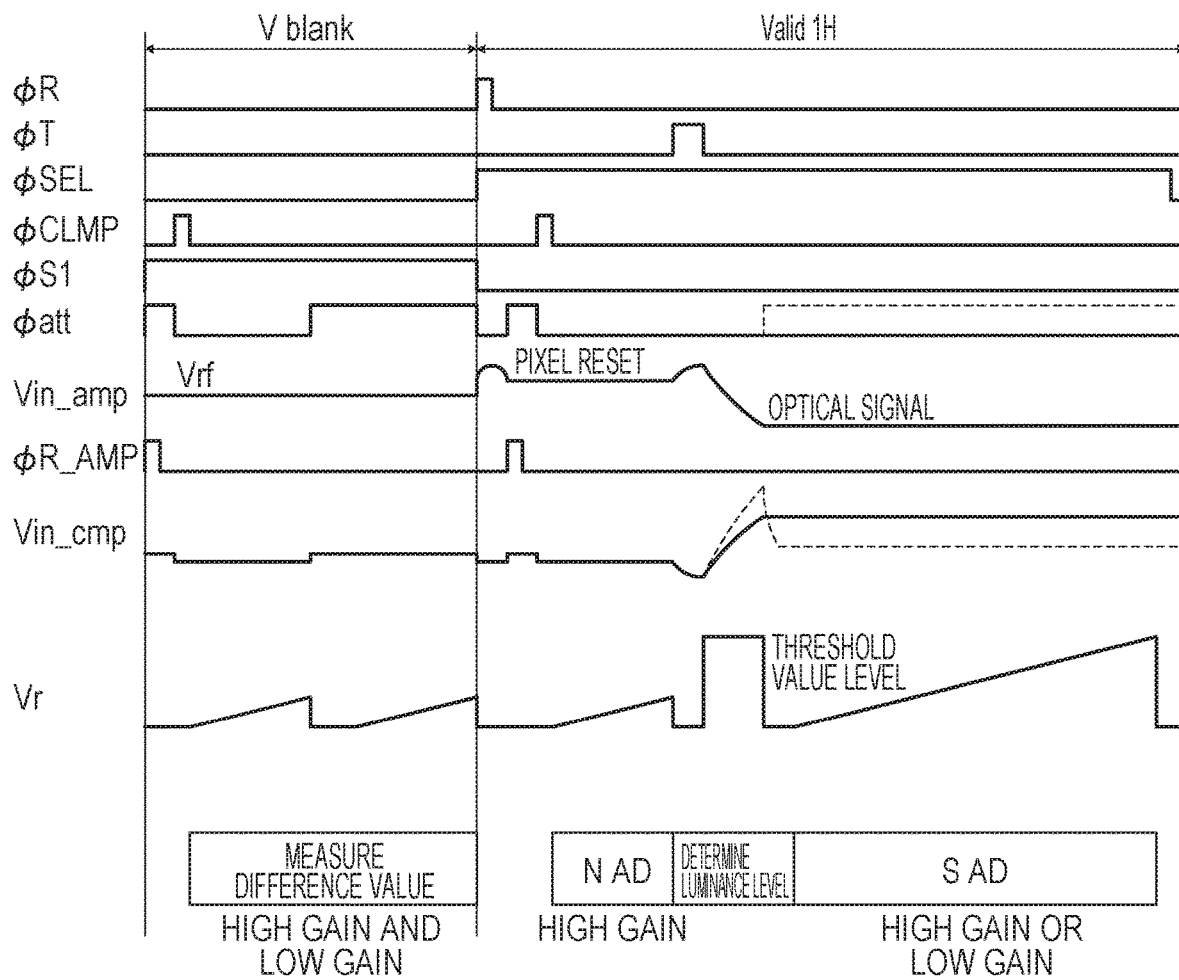
FIG. 13 is a timing chart illustrating operations to be performed by the imaging apparatus.

FIG. 13 is a timing chart illustrating operations in FIGS. 12A and 12B.

A period V blank in FIG. 13 is a vertical blanking period, like FIG. 3. During a period V blank, the control unit changes the signal φS1 to a High level. The amplifier 110 has an input Vin_amp having a value Vrf. The control unit changes signals φR_amp and φatt to a High state and resets the amplifier 110. After the signals φR_amp and φatt are sequentially changed to a Low state and the amplifier 110 is changed to a high gain state, the signal φCLMP is changed to a High state so that the comparator 104 undergoes auto-zero clamp. Next, the ramp signal Vr is ramped up so that an AD conversion is performed with the amplifier 110 having the high gain. Next, the signal φatt is changed to a High state so that the amplifier 110 is changed to have a low gain state. Next, the ramp reference signal Vr is ramped up again so that am AD conversion is performed with the amplifier 110 at the low gain state. Thus, digital values can be obtained at the high gain state and at the low gain state. While the gain switching is performed based on the gradient of the ramp signal in the example in FIG. 3, the gain of the amplifier 110 is directly changed according to this embodiment. In other words, according to this embodiment, the conversion rate of the column circuit is changed based on the gain of the amplifier 110.

During a period Valid 1H when a pixel signal is read out, the control unit changes the signal φS1 to a low state, and the vertical signal line is connected to an input of the amplifier 110. The signals φR_amp, φatt, and φCLMP are sequentially changed to a Low state, and an AD conversion is performed with the amplifier 110 having a high gain amplification state and with the pixel reset state. This period is called "N AD" in FIG. 13. A digital signal is obtained in response to a change of the magnitude relationship between a ramped up ramp reference signal Vr and Vin_cmp. Next, whether the optical signal has an amplitude higher than a threshold value level or not is determined. In FIG. 13, the operation is indicated by "DETERMINE LUMINANCE LEVEL". The control unit determines the magnitude relationship between the signal Vim_cmp and the signal Vr to change the signal φatt.

In a Case where the Optical Signal has an Amplitude Lower than the Threshold Value Level:

The signals Vin_cmp and φatt are indicated by solid lines in FIG. 13. The signal φatt keeps a low state, and the amplifier 110 has the high gain state. By keeping the high gain state, an optical signal undergoes an AD conversion. Referring to FIG. 13, this period is called "S AD".

In a Case where the Optical Signal has an Amplitude Higher than the Threshold Value Level:

The signals Vin_cmp and φatt are indicated by broken lines in FIG. 13. When The control unit detects that Vin_cmp is higher than the threshold value, the signal φatt is changed to a High state. This changes the amplifier 110 to have a low gain state. Next, an AD conversion is performed on the optical signal with the low gain state.

Also in the imaging apparatus according to this embodiment, the AD converting unit 150 for each column obtains a signal code_dif that is a correction value. Thus, like the imaging apparatus according to the first embodiment, the signal processing amount of the signal processing circuit 109 can be reduced, compared with a case where the signal processing circuit 109 generates a correction value for the AD converting unit 150 for each column. Thus, improved performance such as an increased number of pixels and an increased frame rate of an imaging apparatus can be easily achieved.

Seventh Embodiment

Figure 14:
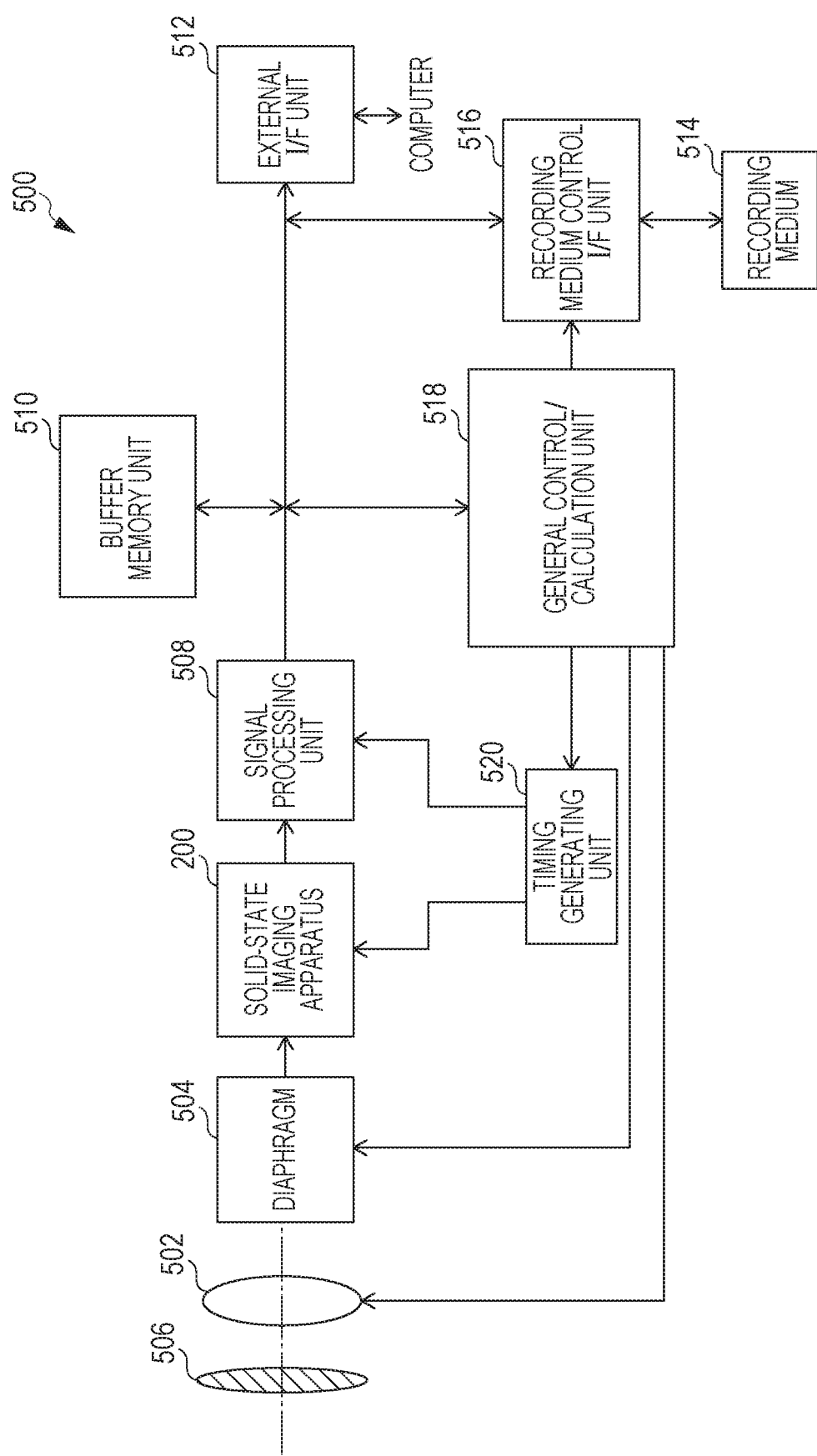
FIG. 14 is a block diagram illustrating a configuration of an imaging system.

FIG. 14 is a block diagram illustrating a configuration of an imaging system 500 according to a seventh embodiment. The imaging system 500 according to this embodiment includes a solid-state imaging apparatus 200 applying a configuration of any one of the imaging apparatuses according to the aforementioned embodiments. Concrete examples of the imaging system 500 may include a digital still camera, a digital camcorder, and a surveillance camera and so on. FIG. 14 illustrates a configuration example of a digital still camera applying the imaging apparatus according to any one of the aforementioned embodiments as the solid-state imaging apparatus 200.

The imaging system 500 illustrated in FIG. 14 has the solid-state imaging apparatus 200, a lens 502 configured to form an optical image of an object on the solid-state imaging apparatus 200, a diaphragm 504 usable for adjusting the quantity of light to pass through the lens 502, and a barrier 506 for protecting the lens 502. The lens 502 and the diaphragm 504 form an optical system configured to gather light to the solid-state imaging apparatus 200.

The imaging system 500 has a signal processing unit 508 configured to process a signal output from the solid-state imaging apparatus 200. The signal processing unit 508 is configured to perform signal processing operations including correcting and compressing an input signal and outputting the processed signal. The signal processing unit 508 is capable of performing AD conversion processing on a signal output from the solid-state imaging apparatus 200. In this case, the solid-state imaging apparatus 200 may not necessarily has an AD conversion circuit internally.

The imaging system 500 further includes a buffer memory unit 510 configured to temporarily store image data and an external interface unit (external I/F unit) 512 for communication with an external computer. The imaging system 500 further includes a recording medium 514 such as a semiconductor memory to and from which image data is written and read and a recording medium control interface unit (recording medium control I/F unit) 516 for writing and reading data to and from the recording medium 514. The recording medium 514 may be internally provided or be detachably mounted in the imaging system 500.

The imaging system 500 further includes an overall control/calculation unit 518 configured to perform different kinds of computing and generally control the imaging system 500 such as a digital still camera and a timing generation unit 520 configured to output timing signals to the solid-state imaging apparatus 200 and the signal processing unit 508. Here, the timing signals may be externally input, and the imaging system 500 may only include at least the solid-state imaging apparatus 200 and a signal processing unit 508 configured to process signals output from the solid-state imaging apparatus 200. The overall control/calculation unit 518 and the timing generation unit 520 may be configured to implement a part or all of control functions of the solid-state imaging apparatus 200.

The solid-state imaging apparatus 200 is configured to output an image signal to the signal processing unit 508. The signal processing unit 508 is configured to perform a predetermined signal process on an image signal output from the solid-state imaging apparatus 200 and output image data. The signal processing unit 508 is further configured to generate an image by using the image signal.

An imaging system applying the solid-state imaging apparatus corresponding to any one of the aforementioned embodiments can provide a higher quality image.

Eighth Embodiment

Figure 15A:
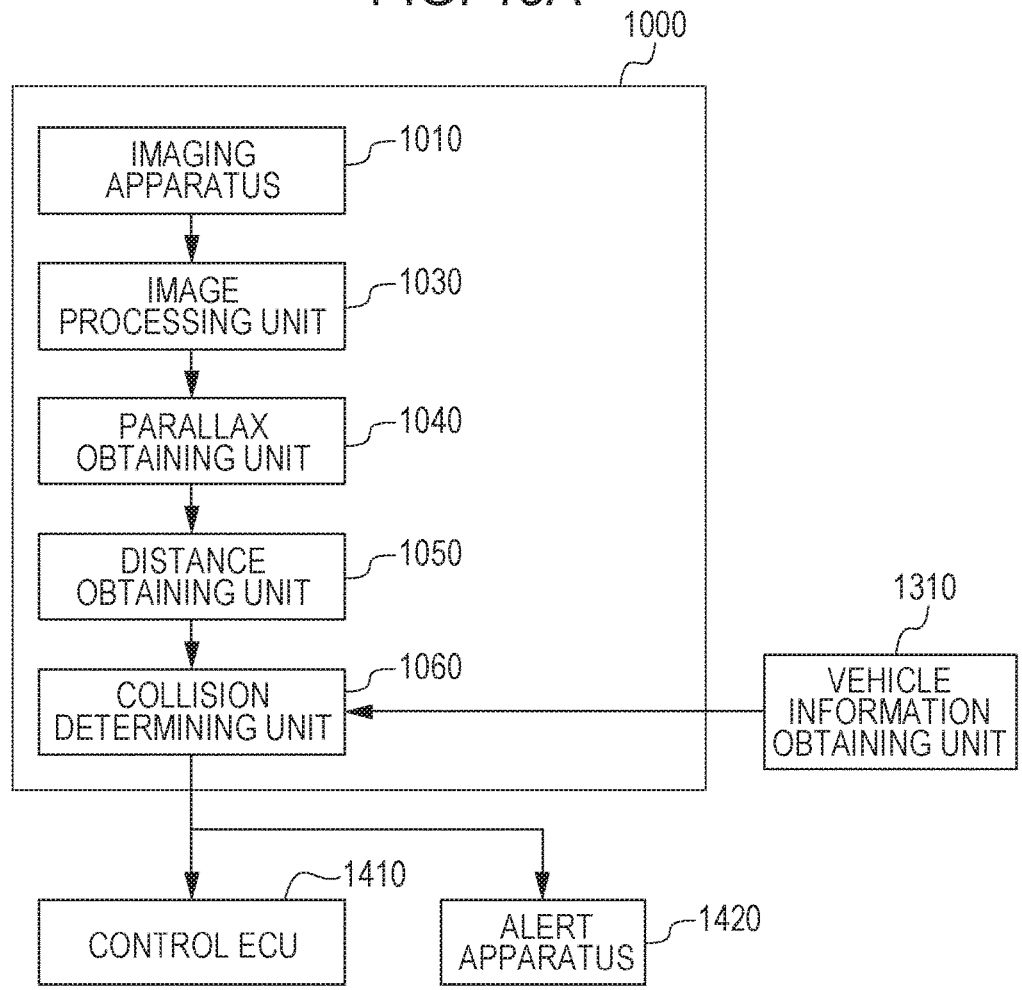
FIGS. 15A and 15B are block diagrams illustrating a configuration of the imaging system.
Figure 15B:
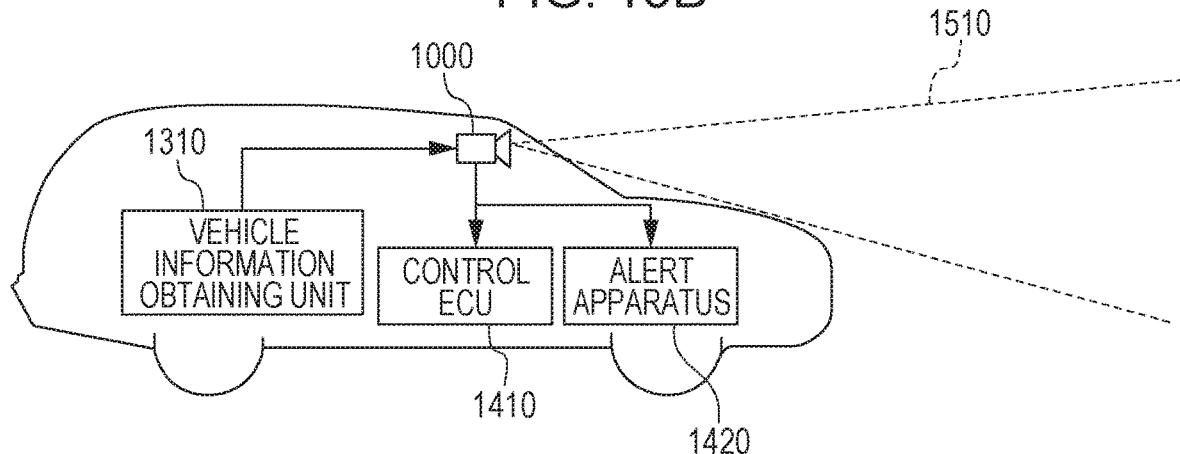

FIG. 15A and FIG. 15B illustrate configurations of an imaging system 1000 and a moving object according to an eighth embodiment. FIG. 15A illustrates an example of the imaging system 1000 relating to a vehicle-mounted camera. The imaging system 1000 has an imaging apparatus 1010. The imaging apparatus 1010 may be any one of the imaging apparatuses according to the aforementioned embodiments. The imaging system 1000 includes an image processing unit 1030 configured to perform an image process on a plurality of image data sets obtained by the imaging apparatus 1010 and a parallax obtaining unit 1040 configured to calculate a parallax (phase difference between parallax images) from the a plurality of image data pieces obtained by the imaging system 1000. The imaging system 1000 further includes a distance obtaining unit 1050 configured to calculate a distance to a target object based on the calculated parallax and a collision determining unit 1060 configured to determine whether there is a collision possibility based on the calculated distance. Here, the parallax obtaining unit 1040 and the distance obtaining unit 1050 are examples of a distance information obtaining unit configured to obtain distance information to a target object. In other words, the distance information is information regarding a parallax, a de-focused amount, and a distance to a target object, for example. The collision determining unit 1060 may determine a collision possibility by using such distance information. The distance information obtaining unit may be implemented by a specifically designed hardware module or software module. The distance information obtaining unit may be implemented by an Field Programmable Gate Array (FPGA), an ASIC (Application Specific Integrated circuit) or the like or a combination thereof.

The imaging system 1000 is connected to a vehicle information obtaining apparatus 1310 and can obtain vehicle information such as a vehicle speed, a yaw rate, and a helm position. A control ECU 1410 is connected to the imaging system 1000. The control ECU 1410 is a control device configured to output a control signal for causing a braking force to the vehicle based on a determination result by the collision determining unit 1060. In other words, the control ECU 1410 is an example of a moving object control unit configured to control a moving object based on distance information. The imaging system 1000 is also connected to an alert apparatus 1420 configured to give an alert to a driver based on a determination result by the collision determining unit 1060. For example, if the collision determining unit 1060 determines that there is a high collision possibility, the control ECU 1410 performs a vehicle control for avoidance of a collision or reduction of damages by braking, releasing the acceleration pedal, or suppressing an engine output, for example. The alert apparatus 1420 warns a user by giving an audio alert, displaying alert information on a screen of a car navigation system, or vibrating a sheet belt or a steering, for example.

According to this embodiment, the imaging system 1000 may be used to capture an image of surroundings of a vehicle such as its front or back. FIG. 15B illustrates the imaging system 1000 in a case where an image of a front (image capturing range 1510) of a vehicle is to be captured. The vehicle information obtaining apparatus 1310 transmits an instruction to the imaging system 1000 to operate and capture an image. Any one of the imaging apparatuses according to the aforementioned embodiments may be used as the imaging apparatus 1010 so that the imaging system 1000 according to this embodiment can have more improved accuracy of focusing.

Having described the example of the control for prevention of collision with another vehicle, this embodiment is also applicable to a control for automatic driving by following another vehicle or a control for preventing the vehicle from crossing over a lane marking, for example. Furthermore, the imaging system is also applicable to not only vehicles such as a vehicle on which the imaging system is mounted but also moving objects (moving apparatuses) such as ships, airplanes and industrial robots. In addition, the imaging system is also applicable to not only moving objects but also apparatuses which apply object identification such as an intelligent transportation system (ITS).

Variation Examples

All of the aforementioned embodiments are merely given for illustrating concrete examples for embodying the present disclosure. The technical scope of the present disclosure should not be limitedly interpreted based on the examples. In other words, various aspects of the embodiments can be implemented without departing from its technical scope or features. Various combinations of the aforementioned embodiments may also be implemented.

According to the present disclosure, an imaging apparatus can be provided which can easily achieve improved signal output performance such as an increased number of pixels and an increased frame rate of the imaging apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-072541 filed Mar. 31, 2017 which is hereby incorporated by reference herein in its entirety.

What is claimed is:

1. An apparatus comprising:
a plurality of pixels arranged in a plurality of columns;
a plurality of circuits arranged correspondingly to the plurality of columns; and
an output line connected to the plurality of circuits,
wherein each of the circuits obtains a difference signal corresponding to a difference between a first signal obtained by converting an analog signal at a first conversion rate and a second signal obtained by converting, at a second conversion rate, the analog signal which is converted at the first conversion rate.

2. The apparatus according to claim 1,
wherein each of the circuits generates an output signal obtained by converting a signal output from each of the pixels at one of the first conversion rate and the second conversion rate, and
wherein a correction value for correcting the output signal is generated based on the difference signal.

3. The apparatus according to claim 2, wherein a correction value for one circuit of the plurality of circuits is applied as a correction value of another circuit of the plurality of circuits.

4. The apparatus according to claim 2,
wherein the plurality of pixels is further arranged in a plurality of rows, and
wherein, every time when signals are read out from pixels of each row of pixels of the plurality of rows, the circuits obtain the correction value.

5. The apparatus according to claim 2,
wherein the plurality of pixels is further arranged in a plurality of rows, and
wherein, during a period when signals are read out from pixels of partial rows of pixels of the plurality of rows, the circuits obtain the correction value.

6. The apparatus according to claim 2,
wherein the plurality of pixels is further arranged in a plurality of rows, and
wherein, during a period after signals are read out from pixels of one row of pixels of the plurality of rows and before signals are read out from the one row next time, the circuits obtain the correction value.

7. The apparatus according to claim 1,
wherein each of the plurality of circuits has an AD converting unit,
wherein the first signal is a digital signal generated by the AD converting unit by performing an AD conversion on the analog signal by using a first ramp signal changing its electric potential at a first rate of change, and
wherein the second signal is a digital signal generated by the AD converting unit by performing an AD conversion on the analog signal by using a second ramp signal changing its electric potential at a second rate of change.

8. The apparatus according to claim 7,
wherein the difference signal is a signal representing a difference between a digital signal corresponding to the analog signal and the first ramp signal and a digital signal corresponding to the analog signal and the second ramp signal.

9. The apparatus according to claim 7,
wherein the AD converting unit has a counter,
wherein the counter generates a first digital signal corresponding to the analog signal and the first ramp signal by changing counting of a clock signal in a case where an AD conversion is performed on the analog signal by using the first ramp signal such that resulting count values change in a first direction, and
wherein the counter generates a second digital signal by changing counting of a clock signal in a case where an AD conversion is performed on the analog signal by using the second ramp signal such that resulting count values change in a second direction opposite to the first direction from the first digital signal as an initial value and wherein the second digital signal is a digital signal representing a difference between the first digital signal and a digital signal corresponding to the analog signal and the second ramp signal.

10. The apparatus according to claim 9, wherein a ratio of a change amount of a count value per unit time period in the counting in the first direction by the counter to a change amount of a count value per unit time period in the counting in the second direction corresponds to a ratio of the first rate of change to the second rate of change.

11. The apparatus according to claim 9, wherein the counter repeats an operation for bringing from a first value to a second value for counting of the clock signal in a case where the AD conversion is performed on the analog signal by using the first ramp signal.

12. The apparatus according to claim 9,
wherein the AD converting unit further has a digital low pass filter circuit and a first memory, and
wherein the first memory holds a signal corresponding to the second digital signal output from the counter through the digital low pass filter circuit.

13. The apparatus according to claim 7,
wherein the AD converting unit further has a second memory,
wherein the second memory holds a first digital signal generated by performing an AD conversion on the analog signal by using the first ramp signal and a second digital signal generated by performing an AD conversion on the analog signal by using the second ramp signal, and
wherein the AD converting unit obtains a digital signal representing a difference between the first digital signal and the second digital signal and held in the second memory.

14. The apparatus according to claim 13, further comprising a counter configured to output a common count signal to the plurality of AD converting units,
wherein the second memories hold the count signal output from the counter.

15. The apparatus according to claim 7,
wherein each of the plurality of pixels outputs an optical signal,
wherein the AD converting unit performs a first comparison comparing an amplitude of a signal corresponding to the optical signal and a threshold value level,
wherein the second rate of change is higher than the first rate of change,
wherein, in a case where the amplitude of the signal corresponding to the optical signal is lower than the threshold value level as a result of the first comparison, the AD converting unit compares the signal corresponding to the optical signal and the first ramp signal, and
wherein, in a case where the amplitude of the signal corresponding to the optical signal is higher than the threshold value level as a result of the first comparison, the AD converting unit compares the signal corresponding to the optical signal and the second ramp signal.

16. The apparatus according to claim 1,
wherein each of the plurality of circuits has an amplifying unit,
wherein a signal converted at the first conversion rate is an amplified signal generated by the amplifying unit by amplifying the analog signal at a first amplification ratio, and
wherein a signal converted by the second conversion rate is an amplified signal generated by the amplifying unit by amplifying the analog signal at a second amplification ratio.

17. The apparatus according to claim 16,
wherein each of the plurality of pixels outputs an optical signal,
wherein each of the circuits performs a first comparison comparing an amplitude of a signal corresponding to the optical signal and a threshold value level,
wherein the second amplification ratio is higher than the first amplification ratio,
wherein, in a case where the amplitude of the signal corresponding to the optical signal is lower than a threshold value level as a result of the first comparison, the amplifying unit amplifies the optical signal at the second amplification ratio, and
wherein, in a case where the amplitude of the signal corresponding to the optical signal is higher than the threshold value level as a result of the first comparison, the amplifying unit amplifies the optical signal at the first amplification ratio.

18. A system comprising:
the apparatus according to claim 1; and
a signal processing unit configured to generate an image by using a signal output from the apparatus.

19. A moving object comprising:
the apparatus according to claim 1;
an obtaining unit configured to obtain distance information to a target object from a parallax image based on a signal from the apparatus; and
a control unit configured to control the moving object based on the distance information.

* * * * *